(12) United States Patent
Chen et al.

(10) Patent No.: US 11,502,160 B2
(45) Date of Patent: Nov. 15, 2022

(54) METHOD AND SYSTEM FOR FORMING METAL-INSULATOR-METAL CAPACITORS

(71) Applicant: Taiwan Semiconductor Manufacturing Co., Ltd., Hsinchu (TW)

(72) Inventors: Wei-Liang Chen, Tainan (TW); Yu-Lung Yeh, Kaohsiung (TW); Chihchous Chuang, Fongshan (TW); Yen-Hsiu Chen, Tainan (TW); Tsai-Ji Liou, Hsinchu (TW); Yung-Hsiang Chen, Tainan (TW); Ching-Hung Huang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 261 days.

(21) Appl. No.: 16/807,034

(22) Filed: Mar. 2, 2020

(65) Prior Publication Data
US 2021/0273038 A1 Sep. 2, 2021

(51) Int. Cl.
*H01L 21/02* (2006.01)
*H01L 49/02* (2006.01)
*H01J 37/32* (2006.01)
*C23C 16/50* (2006.01)
*C23C 16/40* (2006.01)

(52) U.S. Cl.
CPC ............ *H01L 28/40* (2013.01); *C23C 16/405* (2013.01); *C23C 16/50* (2013.01); *H01J 37/3244* (2013.01); *H01J 37/32458* (2013.01); *H01L 21/0223* (2013.01); *H01L 21/02183* (2013.01); *H01L 21/02186* (2013.01); *H01L 21/02252* (2013.01); *H01L 21/02274* (2013.01); *H01J 2237/3321* (2013.01)

(58) Field of Classification Search
CPC ......... H01L 21/02183; H01L 21/02186; H01L 21/0223; H01L 21/02252; H01L 21/02274; H01L 28/40; C23C 16/405; C23C 16/50; H01J 37/3244; H01J 37/32458
USPC ....................................................... 257/532
See application file for complete search history.

(56) References Cited

U.S. PATENT DOCUMENTS

| 10,164,003 B2 | 12/2018 | Lin et al. |
| 10,297,423 B2 | 5/2019 | Tabata et al. |
| 10,304,672 B2 | 5/2019 | Fedosenko et al. |

(Continued)

FOREIGN PATENT DOCUMENTS

| TW | 201315295 A1 | 4/2013 |
| TW | 201503217 A | 1/2015 |

(Continued)

*Primary Examiner* — Brook Kebede
(74) *Attorney, Agent, or Firm* — Seed IP Law Group LLP (57) ABSTRACT

A semiconductor processing system is provided to form a capacitor dielectric layer in a metal-insulator-metal capacitor. The semiconductor processing system includes a precursor tank configured to generate a precursor gas from a metal organic solid precursor, a processing chamber configured to perform a plasma enhanced chemical vapor deposition, and at least one buffer tank between the precursor tank and the processing chamber. The at least one buffer tank is coupled to the precursor tank via a first pipe and coupled to the processing chamber via a second pipe.

20 Claims, 5 Drawing Sheets

(56) References Cited

U.S. PATENT DOCUMENTS

| | | | |
|---|---|---|---|
| 2008/0002330 A1* | 1/2008 | Park | H01L 28/40 |
| | | | 361/311 |
| 2014/0187016 A1* | 7/2014 | Malhotra | H01L 28/65 |
| | | | 438/381 |
| 2014/0315368 A1* | 10/2014 | Hsieh | H01L 21/0234 |
| | | | 438/381 |
| 2018/0171475 A1 | 6/2018 | Maes et al. | |

FOREIGN PATENT DOCUMENTS

| | | |
|---|---|---|
| TW | 201725737 A | 7/2017 |
| TW | 201826334 A | 7/2018 |

* cited by examiner

METHOD AND SYSTEM FOR FORMING METAL-INSULATOR-METAL CAPACITORS

BACKGROUND

Metal-insulator-metal (MIM) capacitors have been widely used in the fields of radio frequency (RF), dynamic random access memory (DRAM), and analog/mixed-signal integrated circuits. A typical MIM capacitor includes two meal electrodes separated by a capacitor dielectric. As density of devices in integrated circuits has increased, there is a continuing challenge to maintain sufficiently high storage capacitance despite decreasing capacitor areas.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions and spatial relationship(s) of the various features may be arbitrarily enlarged or reduced for clarity. Like reference numerals denote like features throughout specification and drawings.

DETAILED DESCRIPTION

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Silicon dioxide ($SiO_2$) and silicon nitride ($Si_3N_4$) are commonly used capacitor dielectrics in MIM capacitors. However, dielectric constants of silicon dioxide and silicon nitride are relatively low (e.g., the dielectric constant (k) of silicon dioxide about 3.9, and k of silicon nitride is about 7), and silicon dioxide and silicon nitride thus are not able to provide sufficient storage capacitance for advanced integrated circuit development. As minimum feature sizes of integrated circuits continue to decrease, MIM capacitors have begun to use high-k dielectric materials as capacitor dielectrics. Because the capacitance of a MIM capacitor is proportional to the dielectric constant of a capacitor dielectric, a high-k dielectric material having a relatively high dielectric constant allows a MIM capacitor to store sufficient energy within a smaller chip area.

Among high-k dielectric materials, tantalum oxide is emerging as one of the most promising high-k materials due to the high dielectric constant (k~25), low leakage current, good dielectric breakdown strength, and high thermal and chemical stability of the tantalum oxide. There are many methods for preparing tantalum oxide thin films, including physical vapor deposition (PVD) and atomic layer deposition (ALD). The PVD method involves bombarding a tantalum target with a high energy plasma. However, the PVD method tends to form tantalum oxide with a higher tantalum (Ta) atomic ratio, which makes the MIM capacitor easily to breakdown. In the ALD method, the tantalum oxide film is formed by depositing a plurality of mono atomic layers in a layer-by-layer manner. Therefore, although the ALD method is able to form a more uniform tantalum oxide film which has a low leakage current, the growth rate of the ALD method is very slow (about $5 \times 10^{-3}$ Å/sec). The ALD method, thus, is not suitable for mass production.

Embodiments of the present disclosure provide a semiconductor processing system that is suitable for forming a capacitor dielectric such as tantalum oxide from a vaporized solid precursor. The deposition of the vaporized solid precursor is carried out using a chemical deposition (CVD) process in a plasma enhanced chemical deposition (PECVD) chamber. The CVD deposition of tantalum oxide is rather fast and is suitable for mass production. The tantalum oxide film formed from the solid precursor exhibits a higher binding energy than a binding energy of a tantalum oxide formed from a conventional liquid precursor. Using the solid precursor thus helps to improve the capacitance of the resulting MIM capacitor.

Figure 1:
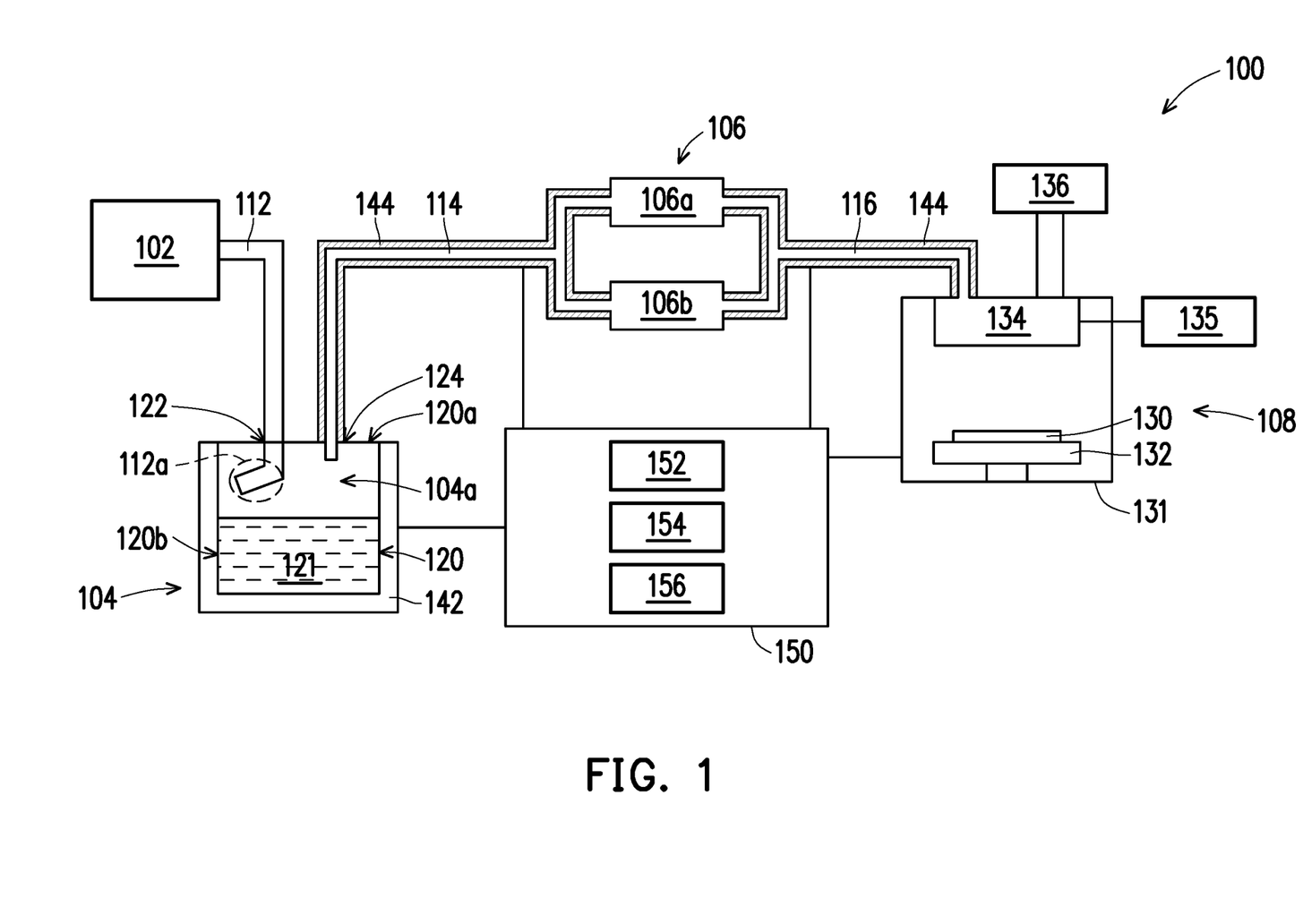
FIG. 1 is a schematic diagram of a semiconductor processing system, in accordance with some embodiments.

FIG. 1 is a schematic diagram of a semiconductor processing system 100, in accordance with some embodiments. The semiconductor processing system 100 is configured to deposit a multi-layer capacitor dielectric layer for fabrication of a MIM capacitor. In some embodiments, the semiconductor processing system 100 includes a carrier gas tank 102, a precursor tank 104, a buffer tank 106, and a processing chamber 108. The precursor tank 104 is downstream of the carrier gas tank 102 and is fluidically coupled to the carrier gas tank 102 via a pipe 112. The buffer tank 106 is downstream of the precursor tank 104 and is fluidically coupled to the precursor tank 104 via a pipe 114. The processing chamber 108 is downstream of the buffer tank 106 and is fluidically coupled to the buffer tank 106 via a pipe 116.

The carrier gas tank 102 is adapted to supply a carrier gas to the precursor tank 104. The carrier gas is usable to carry a precursor gas out of the precursor tank 104. In some embodiments, the carrier gas is an inert gas such as helium, argon, neon, krypton, or a mixture thereof. The carrier gas tank 102 provides a pressurized carrier gas to the precursor tank 104 via the pipe 112.

The precursor tank 104 is adapted to hold a solid precursor 121, vaporize the solid precursor, and supply the vaporized precursor to the processing chamber 108 for CVD deposition. The vaporized precursor is also herein referred to as the precursor gas. The precursor tank 104 includes a housing 120 that defines a sealed interior. The solid precursor 121 fills the lower portion of the housing 120. The housing 120 is generally made from a material substantially inert to the solid precursor 121 and the precursor gas produced therefrom and capable of withstanding the pressure and temperature required to vaporize the solid precursor 121.

The precursor tank 104 includes an inlet port 122 extending through a wall of the housing 120. The inlet port 122 is coupled to the pipe 112, thus allowing the carrier gas flow into the precursor tank 104 via the pipe 112 and mix with the precursor gas formed in the precursor tank. The precursor tank 104 further includes an outlet port 124 extending through a wall of the housing 120. The outlet port 124 is coupled to the pipe 114, thus allowing a process gas that is a mixture of the carrier gas and the precursor gas flow out of the precursor tank 104 via the pipe 114. In some embodiments, the inlet port 122 and the outlet port 124 are provided through a top wall 120a of the housing 120.

The pipe 112 extends into the precursor tank 104 through the inlet port 122 and terminates at an upper portion 104a of the precursor tank 104. The end of the pipe 112 is placed above the solid precursor 121 such that the carrier gas is introduced into the upper portion 104a of the precursor tank 104. The pipe 112 has an angled end portion 112a adapted to direct the flow of the carrier gas towards the sidewall 120b of the housing 120. The angled end portion 112a of the pipe 112 thus helps to prevent the carrier gas that flows out of the pipe 112 from directly impinging onto the solid precursor 121 to disturb the solid precursor 121. Using a pipe with an angled end portion to supply the carrier gas into the precursor tank 104 helps to reduce the risk of contamination of the processing chamber 108 caused by the particulates of the solid precursor 121 becoming airborne and being carried through the outlet port 124 into the processing chamber 108 by the carrier gas. In some embodiments, the pipe 112 is L-shaped with the angled end portion 112a extending perpendicular with respect to the sidewall 120b of the housing 120.

The pipe 114 extends into the precursor tank 104 through the outlet port 124 and terminates at the upper portion 104a of the precursor tank 104. The carrier gas carriers the vaporized solid precursor (i.e., precursor gas) and flows out of the precursor tank 104 via pipe 114.

The buffer tank 106 is disposed between the precursor tank 104 and the processing chamber 108. The buffer tank 106 is adapted to stabilize the pressure of the process gas before the process gas flows into the processing chamber 108 via the pipe 116, especially when solid precursor is used. The buffer tank 106 thus helps to improve the uniformity of gas flow, which in turn helps to promote uniform deposition of the precursor material on the substrate (e.g., substrate 130). In some embodiments, a plurality of buffer tanks 106 (e.g., buffer tank 106a and buffer tank 106b) is employed to ensure that the process gas flowing into the processing chamber 108 is stable in pressure. Although two buffer tanks 106a, 106b are shown in FIG. 1, any number of buffer tanks are contemplated. In some embodiments, a single buffer tank 106 is provided between the precursor tank 104 and the processing chamber 108 to improve gas flow uniformity (not shown). In some embodiments, more than two buffer tanks such as three buffer tanks 106 are provided between the precursor tank 104 and the processing chamber 108 to improve process gas flow uniformity (not shown). Further increase of the number of buffer tanks to more than three does not cause significant improvement in the uniformity of the process gas flow, however, production cost is increased.

The processing chamber 108 is adapted to deposit a capacitor dielectric onto a substrate 130. In some embodiments, the processing chamber 108 is plasma deposition tool configured to perform a plasma enhanced chemical vapor deposition (PECVD) process. In some embodiments, the processing chamber 108 is configured to generate oxygen plasma from an oxygen source.

The processing chamber 108 includes a substrate support 132 and a showerhead 134 disposed inside a housing 131. The substrate support 132 acts as a cathode and the showerhead 134 acts as an anode during the deposition processes. In some embodiments, the substrate support 132 is a pedestal configured to support a substrate, for example, the substrate 130 over which the MIM capacitor is formed. In some embodiments, the substrate support 132 also includes a heating device (not shown) adapted to raise the temperature of the substrate 130 to above room temperature. In some embodiments, the heating device is a single or multiple zone heater, such as a dual radial zone heater having radially inner or outer heating elements. The showerhead 134 is placed in opposition to the substrate support 132. The showerhead 134 includes a plurality of apertures configured to allow an oxygen plasm to be uniformly delivered through the showerhead 134 to the substrate 130.

The showerhead 134 is coupled a radio frequency (RF) generator 135 outside of the housing 131. The RF generator 135 is used in conjunction with the showerhead 134 to excite oxygen that is flowed into the processing chamber 108 to generate an oxygen plasma. In some embodiments, the oxygen plasma is configured to generate a plasma from a cleaning gas generated using a mixed gas containing oxygen and inert gases. In some embodiments, the gas mixture includes an oxygen concentration from about 2% to about 4% by volume of the gas mixture. Suitable inert gases that can be used to form the gas mixture with oxygen include, but are not limited to, krypton, argon, and helium.

In some embodiments, the semiconductor processing system 100 also includes a remote plasma source (RPS) 136 outside the housing 131 of the processing chamber 108. The RPS is configured to generate a fluorine-containing plasma from a fluorine-containing cleaning gas that is flowed in the processing chamber 108. The fluoride-containing plasma is applied to clean the interior surface of the processing chamber 108 after the dielectric deposition. In some embodiments, the fluoride-containing plasma is a $NF_3$ plasma.

The semiconductor processing system 100 further includes a heating device 142 configured to heat the precursor tank 104 to a temperature sufficient to vaporize the solid precursor 121. In some embodiments and as shown in FIG. 1, the heating device 142 is a jacket-type heating device surrounding at least the lower portion of the precursor tank 104 that contains the solid precursor 121. In some embodiments, the heating device 142 is located beneath the precursor tank 104 such that the heating device 142 only heats the solid precursor 121 from bottom of the precursor tank 104 (not shown). During the deposition processing, the solid precursor 121 in the precursor tank 104 is heated by the heating device 142 to a temperature sufficient to transform the solid precursor 121 into a vapor, thus forming the precursor gas. The precursor gas mixes with the carrier gas and the resulting process gas containing the precursor gas and the carrier gas flows out of the precursor tank 104 through the pipe 114 into the buffer tank 106. The process gas passes through the buffer tank 106 and flows into the processing chamber 108 for CVD deposition. In order to prevent the re-solidification of the precursor gas as the process gas is transported from the precursor tank 104 to the processing chamber 108 through pipes 114 and 116, each of the pipes 114 and 116 along the process gas transportation path is insulated or heated by a temperature control element 144. In some embodiments, the temperature control element 144 is a heating device configured to heat the corresponding pipe 114 or 116. In some embodiments, the temperature control element 144 is an insulating material wrapping around the corresponding pipe 114, 116. The insulating material helps to reduce the heat loss of the process gas as the process gas flows through the pipes 114 and 116, thereby helping to prevent the precursor gas from re-solidification.

In some embodiments, the semiconductor processing system 100 includes a control system 150 that controls one or more operations of the semiconductor processing system 100. For example, in some embodiments, the control system 150 controls the heating device 142 to adjust temperature of the heating device 142 to account for detected or expected changes in pressure as the solid precursor is vaporized. In some embodiments, the control system 150 controls the temperature control elements 144 to adjust temperature of the process gas, thereby preventing the re-solidification of the precursor gas as the process gas flows from the precursor tank 104 to the processing chamber 108. In some embodiments, the control system 150 controls the generation of the oxygen plasma and the flow rates of the process gas into the processing chamber 108.

In some embodiments, the control system 150 includes a processor 152, a computer readable memory 154, and support circuits 156. In some embodiments, the processor 152 is a central processing unit (CPU), a multi-processor, a distributed processing system, an application specific integrated circuit (ASIC), and/or a suitable processing unit. In some embodiments, the computer readable memory 154 is an electronic, magnetic, optical, electromagnetic, infrared, and/or a semiconductor system (or apparatus or device). For example, the computer readable memory 154 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable memory 154 includes a compact disk-read only memory (CD-ROM), a compact disk-read/write (CD-R/W), and/or a digital video disc (DVD). In some embodiments, the computer readable memory 154 includes machine readable instructions that when executed by the processor 152, cause the control system 150 to send command signals to the one or more components of the semiconductor processing system 100.

Figure 2:
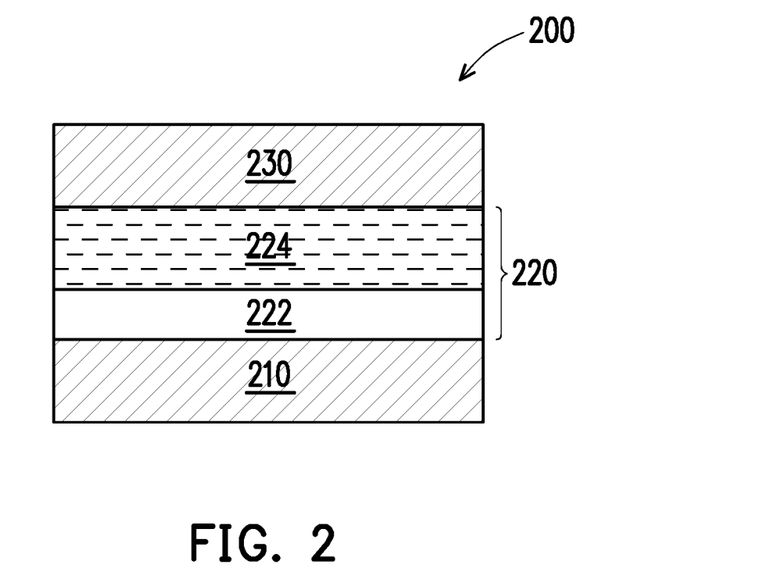
FIG. 2 is a cross-sectional view of a MIM capacitor, in accordance with some embodiments.

FIG. 2 is a cross-sectional view of a MIM capacitor 200, in accordance with some embodiments of the present disclosure. Referring to FIG. 2, the MIM capacitor 200 includes a capacitor bottom electrode 210, a capacitor top electrode 230, and a capacitor dielectric layer 220 between the capacitor bottom electrode 210 and the capacitor top electrode 230. The capacitor dielectric layer 220 is adapted to electrically separate the capacitor bottom electrode 210 from the capacitor top electrode 230 so that charges can accumulate at the interfaces between the capacitor dielectric layer 220 and respective capacitor bottom electrode 210 and capacitor top electrode 230. The accumulated charges generate an electric field between the capacitor bottom electrode 210 and the capacitor top electrode 230, so that the MIM capacitor 200 is able to store energy.

The capacitor bottom electrode 210 includes a first conductive metal such as, for example titanium (Ti), titanium nitride (TiN), tantalum (Ta), or tantalum nitride (TaN). In some embodiments, the capacitor bottom electrode 210 includes TiN.

The capacitor dielectric layer 220 has a multilayer structure. In some embodiments, the capacitor dielectric layer 220 includes a first capacitor dielectric layer 222 and a second capacitor dielectric layer 224.

The first capacitor dielectric layer 222 is disposed on the capacitor bottom electrode 210 and directly contacts the capacitor bottom electrode 210. The first capacitor dielectric layer 222 includes a metal oxide that is formed by oxidizing the metal in the underlying capacitor bottom electrode 210. For example, in some embodiments when the capacitor bottom electrode 210 include TiN, the first capacitor dielectric layer 222 includes titanium oxide ($TiO_x$ where x ranges from 0.5 to 2).

The second capacitor dielectric layer 224 is disposed over the first capacitor dielectric layer 222. In some embodiments, the second capacitor dielectric layer 224 includes tantalum oxide ($Ta_xO_y$, where y:x is no greater than 2.5). Other high-k dielectric materials having a dielectric constant greater than silicon nitride, such as $TiO_x$, zirconium oxide ($ZrO_x$), or hafnium oxide ($HfO_x$), can also be used in the second capacitor dielectric layer 224.

In some embodiments, the metal oxide in the first capacitor dielectric layer 222 is selected to have a dielectric constant greater than the dielectric constant of the high-k dielectric material in the second capacitor dielectric layer 224. In such embodiments, the presence of the first capacitor dielectric layer 222 causes the MIM capacitor 200 to have a higher capacitance than a MIM capacitor that does not have the first capacitor dielectric layer 222. Increasing the thickness of the first capacitor dielectric layer 222 relative to the thickness of the second capacitor dielectric layer 224 causes an increase in the capacitance of the MIM capacitor 200, but with a decrease in the resistance to time dependent dielectric breakdown (TDDB). The ratio of the thickness of the first capacitor dielectric layer 222 and thickness of the second capacitor dielectric layer 224 thus is selected to provide the MIM capacitor 200 with a maximize capacitance while at the same time maintaining a good resistance to TDDB. In some embodiments, the first capacitor dielectric layer 222 has a thickness ranging from about 5 angstroms (Å) to about 50 Å, and the second capacitor dielectric layer 224 has a thickness ranging from about 50 Å to about 1000 Å. If the thickness of each of the first and second capacitor dielectric layer 222, 224 is too great, the capacitance of the MIM capacitor 200 is too low, in some instances. On the other hand, if the thickness of each of the first and second capacitor dielectric layer 222, 224 is too small, the risk of current breakdown of the MIM capacitor 200 increases, in some embodiments. In some embodiments, the capacitor dielectric layer 220 includes a bilayer of $TiO_x/Ta_xO_y$ with a dielectric constant from about 30 to about 40, the resulting MIM capacitor can have a capacitance ranging from 5 fF to 10 fF.

The capacitor top electrode 230 is disposed on the second capacitor dielectric layer 224. In some embodiments, the capacitor top electrode 230 includes a second conductive metal that is same as, or different from, the first conductive metal providing the capacitor bottom electrode 210. For example, the capacitor top electrode 230 includes Ti, TiN, Ta, or TaN. In some embodiments, the capacitor top electrode 230 includes TiN.

Figure 3:
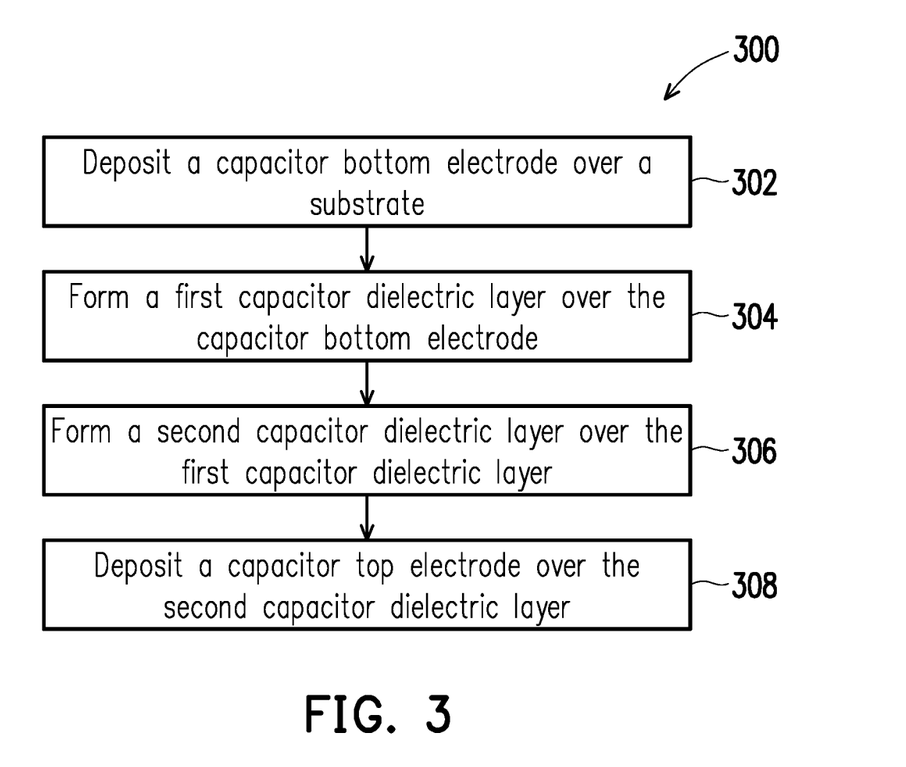
FIG. 3 is a flowchart of a method for forming a MIM capacitor, in accordance with some embodiments.

FIG. 3 is a flowchart of a method 300 of forming a MIM capacitor, for example, MIM capacitor 200, in accordance with some embodiments. FIGS. 4A-4D are cross-sectional views of the MIM capacitor 200 in various fabrication stages of the method 300, in accordance with some embodiments. The method 300 is discussed in detail below, with reference to the MIM capacitor 200 in FIGS. 4A-4D.

Figure 4A:
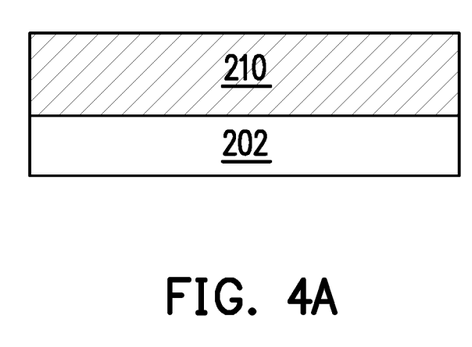
FIGS. 4A-4D are cross-sectional views of the MIM capacitor in various fabrication stages of the method of FIG. 3.

Referring to FIGS. 3 and 4A, the method 300 includes operation 302, in which a capacitor bottom electrode 210 is deposited over a substrate 202, in accordance with some embodiments. In some embodiments, the capacitor bottom electrode 210 includes a first conductive metal such as, for example titanium (Ti), titanium nitride (TiN), tantalum (Ta), or tantalum nitride (TaN), and is deposited over the substrate 202 using a deposition process such as, for example, PVD.

In some embodiments, the substrate 202 is a silicon substrate. In some embodiments, the substrate 202 include an elementary semiconductor, such as germanium; a compound semiconductor, such as silicon germanium, silicon carbide, gallium arsenic, gallium phosphide, indium phosphide, indium arsenide, and/or indium antimonide; or combinations thereof. In some embodiments, the substrate 202 is a silicon-on-insulator (SOI) structure with an insulator layer in the substrate. An exemplary insulator layer may be a buried oxide layer (BOX). In some embodiments, the substrate 202 further includes various doped features depending on design requirements. The doped features may be doped with p-type dopants, such as boron; n-type dopants, such as phosphorus or arsenic; or combinations thereof. The doped features may be formed by ion implantations and are configured to form one or more devices, such as field-effect transistors (FETs), diodes, memory devices or a combination thereof. In some embodiments, the substrate 202 further includes a multilayer interconnection structure to couple various devices to form a functional circuit. The multilayer interconnect structure includes vertical interconnects, such as vias or contacts, and horizontal interconnects, such as metal lines. The various interconnect features are implemented using various conductive materials including copper, tungsten, and/or silicide. In some embodiments, the capacitor bottom electrode 210 is configured in the nth metallization layer of the multilayer interconnect structure and is simultaneously formed with the nth metallization layer.

Figure 4B:
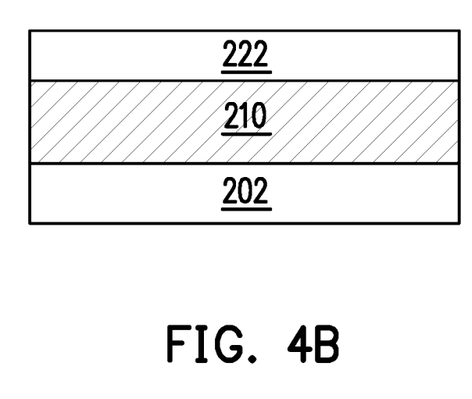

Referring to FIGS. 3 and 4B, the method 300 proceeds to operation 304, in which a first capacitor dielectric layer 222 is formed over the capacitor bottom electrode 210, in accordance with some embodiments. The first capacitor dielectric layer 222 is formed by selective oxidation of a surface portion of the capacitor bottom electrode 210 using oxygen plasm. In some embodiments, the plasma oxidation process is carried out in the processing chamber 108 of the semiconductor processing system 100 (FIG. 1). After mounting the substrate 202 onto the substrate support 132, an oxygen plasma that is generated by the RF generator 135 is flowed into the processing chamber 108. The oxygen plasma flows through the showerhead 134 towards the surface of the capacitor bottom electrode 210. The surface of the capacitor bottom electrode 210 is thus exposed to the oxygen plasma. The conductive metal in the surface portion of the capacitor bottom electrode 210 reacts with the oxygen, forming the first capacitor dielectric layer 222 on the surface of the capacitor bottom electrode 210. The first capacitor dielectric layer 222 thus includes an oxide of the conductive metal in the surface portion of the capacitor bottom electrode 210. In some embodiments, the plasma oxidation of the surface portion of the capacitor bottom electrode 210 is carried out at a temperature ranging from about 300° C. to about 500° C.

Figure 4C:
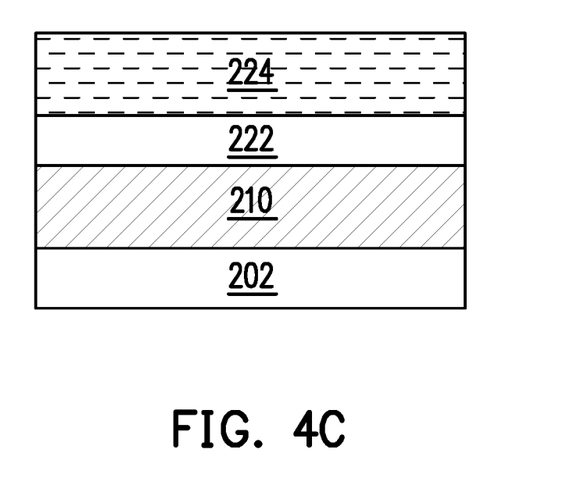

Referring to FIGS. 3 and 4C, the method 300 proceeds to operation 306, in which a second capacitor dielectric layer 224 is formed over the first capacitor dielectric layer 222, in accordance with some embodiments. The second capacitor dielectric layer 224 is formed from a solid precursor 121 using the semiconductor processing system 100 (FIG. 1) of the present disclosure. Forming the second capacitor dielectric layer 224 includes first providing a solid precursor 121 in a precursor tank 104. The precursor tank 104 is then heated using the heating device 142 to a temperature at which the solid precursor 121 is vaporized, forming a precursor gas. The precursor gas is mixed with a carrier gas that is flowed into the precursor tank 104 via pipe 112 to provide a process gas. The process gas containing the precursor gas and the carrier gas then flows from the precursor tank 104 to the buffer tank 106 within which the pressure of the process gas is stabilized. Next, the process gas flows from the buffer tank 106 to the processing chamber 108. The precursor in the process gas decomposes at the surface of the substrate 202 (i.e., surface of the first capacitor dielectric layer 222) to form a precursor metal-containing layer. The precursor metal in the precursor metal-containing layer then reacts oxygen to form the second capacitor dielectric layer 224.

In some embodiments, the oxygen plasma used for oxidizing the surface portion of the capacitor bottom electrode 210 is stopped before the process gas flows into the processing chamber 108 for formation of the second capacitor dielectric layer 224. In other embodiments, the oxygen plasma used for oxidizing the surface portion of the capacitor bottom electrode 210 is continuously generated as the process gas flows into the processing chamber 108 for formation of the second capacitor dielectric layer 224.

The types of solid precursor 121 is chosen based on the capacitor dielectric being formed in the processing chamber 108. In some embodiments, the precursor gas is a tantalum-containing gas formed from vaporization of a tantalum-containing solid precursor such as pentakis(dimethylamido) tantalum (PDMAT; $Ta(NH_2)(CH_3)_2)_5$), and the resulting second capacitor dielectric layer 224 includes $Ta_xO_y$ with y:x no great than 2.5. In some embodiments, the binding energy of $Ta_xO_y$ of the present disclosure measured by X-ray photoelectron spectroscopy (XPS) is from about 24 eV to about 26 eV, which is lower than the binding energy of $Ta_xO_y$ formed from a liquid precursor. The lower binding energy indicates that the Ta composition in $Ta_xO_y$ that is formed from a tantalum-containing solid precursor is higher than the stoichiometric composition in equilibrium phase diagrams. That is, y:x in $Ta_xO_y$ is less than 2.5. The range of the binding energy of $Ta_xO_y$ of the present disclosure from about 24 eV to about 26 eV corresponds to y:x from about 1.9 to about 2.3. In some embodiments, y:x is 1.94. The increased tantalum concentration in $Ta_xO_y$ indicates that the $Ta_xO_y$ layer formed from the tantalum-containing solid precursor has a dielectric constant higher than of the $Ta_xO_y$ layer formed from a tantalum-containing liquid precursor.

Figure 4D:
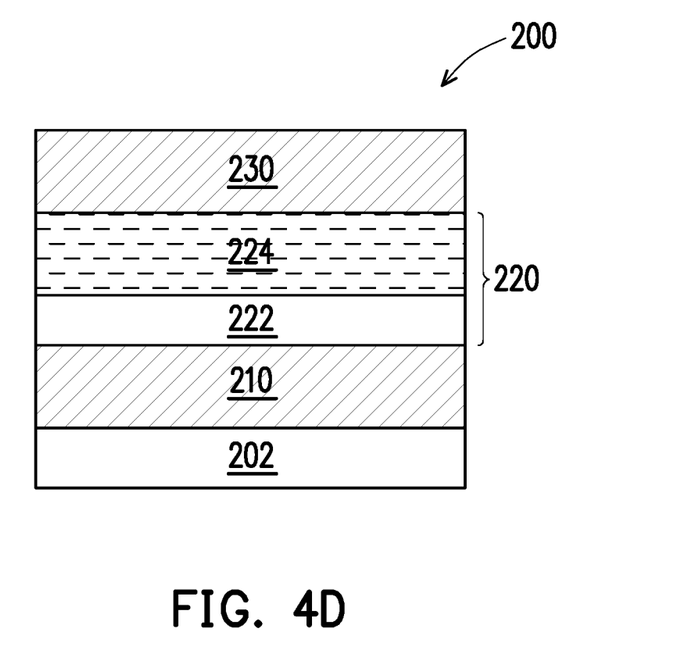

Referring to FIGS. 3 and 4D, the method 300 proceeds to operation 308, in which a capacitor top electrode 230 is deposited over the second capacitor dielectric layer 224, thereby forming the MIM capacitor 200 that includes the capacitor bottom electrode, 210, the first capacitor dielectric layer 222, the second capacitor dielectric layer 224, and the capacitor top electrode 230, in accordance with some embodiments. The capacitor top electrode 230 includes a conductive metal the same as, or different from, the conductive metal that provides the capacitor bottom electrode 210. For example, the capacitor top electrode 230 includes Ti, TiN, Ta, or TaN. In some embodiments, the capacitor top electrode 230 includes TiN and is formed by a deposition process such as PVD. In some embodiments, the capacitor top electrode 230 is configured in the n+1th metallization layer of the multilayer interconnect structure and is simultaneously formed with the n+1th metallization layer.

Figure 5:
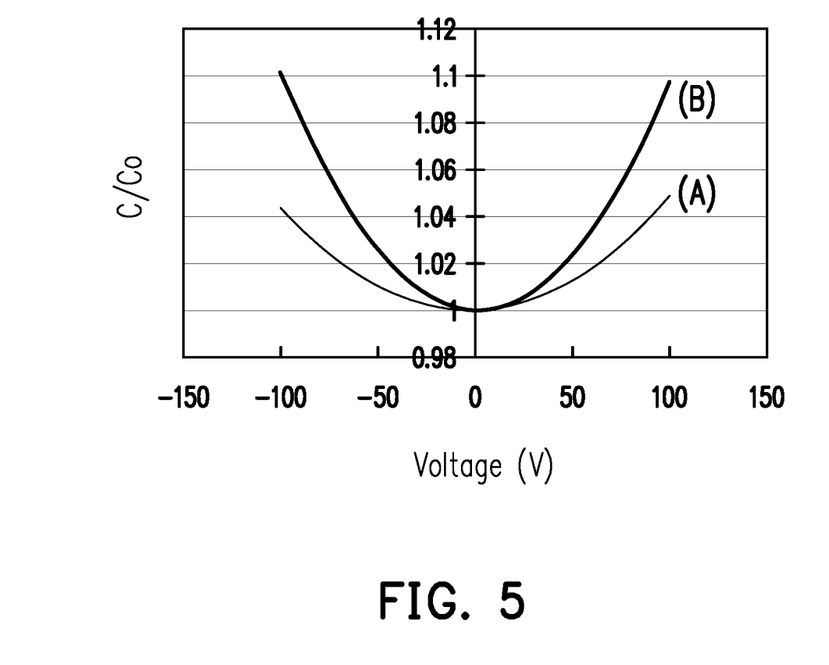
FIG. 5 are graphs each illustrating the voltage dependence of the capacitance of a MIM capacitor using tantalum oxide as a capacitor dielectric.

FIG. 5 are graphs illustrating the capacitance changes as the voltage is swept from −100 V to +100V in a MIM capacitor having a structure of TiN/TiO$_2$/Ta$_x$O$_y$/TiN. Ta$_x$O$_y$ in the MIM capacitor (A) is formed from a solid precursor such as PDMAT, and Ta$_x$O$_y$ in the MIM capacitor (B) is formed from a liquid precursor such as tertbutylimidotris (diethylamido)tantalum (TBTDET). The capacitance change is expressed as C/Co, where C represents a capacitance value at a voltage applied, and Co represents a capacitance value at 0 V. FIG. 5 shows that the maximum capacitance change in the MIM capacitor (A) is about 5% when the voltage is changed from 0 V to +/−100V, while the maximum capacitance change in the MIM capacitor (B) is about 10% when the applied voltage is changed from 0 V to +/−100 V. The maximum capacitance change in the MIM capacitor (B) is about 2 times as the capacitance change in the MIM capacitor (A). The smaller capacitance change in the MIM capacitor (A) indicates that a more stable MIM capacitor can be obtained as the Ta$_x$O$_y$ capacitor dielectric is formed from the solid precursor.

One aspect of this description relates to a semiconductor processing system. The semiconductor processing system includes a precursor tank configured to generate a precursor gas from a metal organic solid precursor, a processing chamber configured to perform a plasma enhanced chemical vapor deposition, and at least one buffer tank between the precursor tank and the processing chamber. The at least one buffer tank is coupled to the precursor tank via a first pipe and coupled to the processing chamber via a second pipe. In some embodiments, the system further includes a carrier gas tank configured to supply a carrier gas to the precursor tank. The carrier gas tank is coupled to the precursor tank via a third pipe. In some embodiments, the third pipe extends into an interior of the precursor tank. Third pipe has an angled end portion extending towards a sidewall of the precursor tank. In some embodiments, the angled end portion of the third pipe extends at a right angle towards the sidewall of the precursor tank. In some embodiments, the system further includes a heating device configured to heat the precursor tank. In some embodiments, the system further includes a first temperature control element configured to control a temperature of the first pipe. In some embodiments, the system further includes a second temperature control element configured to control a temperature of the second pipe. In some embodiments, the system further includes a control system configured to control operation of each of the heating device, the first temperature control element, and the second temperature control element. In some embodiments, the first pipe and the second pipe are covered by an insulating material. In some embodiments, the at least one buffer tank includes a plurality of buffer tanks, each of the plurality of buffer tanks having a first end coupled to the precursor tank and a second end coupled to the processing chamber.

Another aspect of this description relates to a metal-insulator-metal (MIM) capacitor. The MIM capacitor includes a capacitor bottom electrode comprising a first metal. The MIM capacitor further includes a capacitor dielectric layer over the capacitor bottom electrode. The capacitor dielectric layer includes a first capacitor dielectric layer over the capacitor bottom electrode. The first capacitor dielectric layer includes an oxide of the first metal. The capacitor dielectric layer further includes a second capacitor dielectric layer over the first capacitor dielectric layer. The second capacitor dielectric layer includes tantalum oxide having a binding energy from about 24 eV to about 26 eV. The MIM capacitor further includes a capacitor top electrode over the second capacitor dielectric layer. The capacitor top electrode includes a second metal. In some embodiments, the capacitor bottom electrode includes titanium nitride, and the first capacitor dielectric layer includes titanium oxide. In some embodiments, the tantalum oxide has a formula of Ta$_x$O$_y$, wherein y:x is less than 2.5. In some embodiments, the MIM capacitor has a capacitance ranging from 5 fF to 10 fF. In some embodiments, the second metal is the same as the first metal.

Still another aspect of this description relates to a method of forming a metal-insulator-metal (MIM) capacitor. The method includes forming a capacitor bottom electrode comprising a first metal over a substrate. The method further includes forming a first capacitor dielectric layer over the capacitor bottom electrode. Forming the first capacitor dielectric layer includes oxidizing a surface portion of the capacitor bottom electrode. The method further includes forming a second capacitor dielectric layer over the first capacitor dielectric layer. Forming the second capacitor dielectric layer includes providing a solid precursor in a precursor tank, vaporizing the solid precursor to form a precursor gas in the precursor tank, flowing a process gas containing the precursor gas and a carrier gas from the precursor tank to at least one buffer tank, and flowing the process gas from the at least one buffer tank to a processing chamber. In some embodiments, forming the first capacitor dielectric layer includes exposing a surface of the capacitor bottom electrode to an oxygen plasma. In some embodiments, the process gas is flowed into the processing chamber after stopping the oxygen plasma. In some embodiments, the process gas is flowed into the processing chamber in-situ with and in addition to the oxygen plasma. In some embodiments, the method further includes depositing a capacitor top electrode over the second capacitor dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a metal-insulator-metal (MIM) capacitor, comprising:
   depositing a capacitor bottom electrode comprising a first metal;

forming a capacitor dielectric layer over the capacitor bottom electrode, the capacitor dielectric layer comprising:
  a first capacitor dielectric layer over the capacitor bottom electrode, the first capacitor dielectric layer comprising an oxide of the first metal; and
  a second capacitor dielectric layer over the first capacitor dielectric layer, the second capacitor dielectric layer comprising tantalum oxide having a binding energy from about 24 eV to about 26 eV,
  wherein the second capacitor dielectric layer is formed by:
    vaporizing a tantalum-containing solid precursor to provide a vaporized tantalum-containing precursor;
    forming a tantalum layer on the first capacitor dielectric layer as the vaporized tantalum-containing precursor contacts the first capacitor dielectric layer and decomposes thereon; and
    oxidizing the tantalum layer; and
  depositing a capacitor top electrode over the second capacitor dielectric layer, the capacitor top electrode comprising a second metal.

2. The method of claim 1, wherein the capacitor bottom electrode comprises titanium nitride, and the first capacitor dielectric layer comprises titanium oxide.

3. The method of claim 1, wherein the tantalum oxide has a formula of $Ta_xO_y$, wherein y:x is no greater than 2.5.

4. The method of claim 1, wherein the MIM capacitor has a capacitance ranging from 5 fF to 10 fF.

5. The method of claim 1, wherein the second metal is the same as the first metal.

6. A method of forming a metal-insulator-metal (MIM) capacitor, comprising:
  forming a capacitor bottom electrode over a substrate;
  forming a first capacitor dielectric layer over the capacitor bottom electrode, forming the first capacitor dielectric layer comprising oxidizing a surface portion of the capacitor bottom electrode; and
  forming a second capacitor dielectric layer over the first capacitor dielectric layer, wherein forming the second capacitor dielectric layer comprises:
    providing a solid precursor in a precursor tank;
    vaporizing the solid precursor to form a precursor gas in the precursor tank;
    flowing a process gas containing the precursor gas and a carrier gas from the precursor tank to at least one buffer tank; and
    flowing the process gas from the at least one buffer tank to a processing chamber.

7. The method of claim 6, wherein forming the first capacitor dielectric layer comprises exposing a surface of the capacitor bottom electrode to an oxygen plasma.

8. The method of claim 7, wherein the process gas is flowed into the processing chamber after stopping the oxygen plasma.

9. The method of claim 7, wherein the process gas is flowed into the processing chamber in-situ with and in addition to the oxygen plasma.

10. The method of claim 6, further comprising depositing a capacitor top electrode over the second capacitor dielectric layer.

11. The method of claim 6, wherein the first capacitor dielectric layer comprises titanium oxide.

12. The method of claim 6, wherein the second capacitor dielectric layer comprises $Ta_xO_y$, wherein y:x is no greater than 2.5.

13. The method of claim 6, further comprising stabilizing a pressure of the process gas before flowing the process gas into the processing chamber.

14. A method of forming a metal-insulator-metal (MIM) capacitor, comprising:
  depositing a first electrode over a substrate
  forming a first dielectric layer over the first electrode;
  heating a solid precursor contained in a precursor tank to a temperature that vaporizes the solid precursor to provide a precursor gas;
  flowing the precursor gas into a processing chamber to contact the first dielectric layer;
  forming a precursor metal layer on the first dielectric layer by decomposing the precursor gas;
  oxidizing the precursor metal in the precursor metal layer to form a second dielectric layer on the first dielectric layer; and
  depositing a second electrode on the second dielectric layer.

15. The method of claim 14, further comprising generating an oxygen plasma in the processing chamber.

16. The method of claim 15, wherein forming the first dielectric layer comprises oxidizing a surface portion of the first electrode by the oxygen plasma.

17. The method of claim 16, wherein oxidizing the surface portion of the first electrode is carried out at a temperature ranging from 300° C. to 500° C.

18. The method of claim 14, wherein the solid precursor is a tantalum (Ta)-containing solid precursor.

19. The method of claim 14, wherein the first dielectric layer comprises titanium oxide and the second dielectric layer comprises $Ta_xO_y$ with y:x no great than 2.5.

20. The method of claim 14, wherein the first electrode and the second electrode independently comprise titanium (Ti), titanium nitride (TiN), tantalum (Ta) or tantalum nitride (TaN).

* * * * *